United States Patent [19]

McCormick

[11] Patent Number: 5,780,924
[45] Date of Patent: Jul. 14, 1998

[54] INTEGRATED CIRCUIT UNDERFILL RESERVOIR

[75] Inventor: John P. McCormick, Redwood City, Calif.

[73] Assignee: LSI Logic Corporation, Milpitas, Calif.

[21] Appl. No.: 644,000

[22] Filed: May 7, 1996

[51] Int. Cl.⁶ ............................................. H01L 23/495
[52] U.S. Cl. ........................... 257/667; 257/687; 257/787; 438/124; 438/126; 438/127
[58] Field of Search ..................... 257/667, 687, 257/787; 438/124, 126, 127

[56] References Cited

U.S. PATENT DOCUMENTS

| | | | |
|---|---|---|---|
| 4,556,896 | 12/1985 | Meddles | 257/667 |
| 4,611,398 | 9/1986 | Eames et al. | 257/667 |
| 4,803,544 | 2/1989 | Holzschuh et al. | 257/667 |
| 5,278,446 | 1/1994 | Nagaraj et al. | 257/667 |
| 5,302,850 | 4/1994 | Hara | 257/667 |
| 5,371,044 | 12/1994 | Yoshida et al. | 257/667 |
| 5,583,370 | 12/1996 | Higgins, III et al. | 257/667 |

FOREIGN PATENT DOCUMENTS

| | | | |
|---|---|---|---|
| 62-208651 | 9/1987 | Japan | 257/667 |
| 5-343568 | 12/1993 | Japan | 257/667 |

*Primary Examiner*—David Ostrowski
*Attorney, Agent, or Firm*—Luedeka, Neely & Graham, P.C.

[57] ABSTRACT

A method of packaging an integrated circuit. An integrated circuit is connected to a substrate. A reservoir body is applied to the substrate, and the reservoir body and substrate define at least one reservoir and at least one flow gate. The reservoir body, substrate, and integrated circuit define a flow ring which extends at least partially around the circumference of the integrated circuit. A compound is dispensed into the reservoirs, and is flowed through the flow gates and into the flow ring, underfilling the integrated circuit.

13 Claims, 2 Drawing Sheets

INTEGRATED CIRCUIT UNDERFILL RESERVOIR

FIELD OF THE INVENTION

This invention relates to the field of integrated circuit packaging. More particularly the invention relates to the field of underfilling flip chips.

BACKGROUND OF THE INVENTION

Integrated circuits are typically packaged prior to use, to protect them from subsequent handling and the environment in which they will be used. As a part of the packaging process, some types of integrated circuits, such as flip chips, are typically underfilled prior to encapsulation.

The underfilling process is intended to fill the gap that would otherwise exist between the surface of the flip chip and the surface of the substrate to which the flip chip is electrically connected. The electrical connections are made by small solder bumps which are placed between the flip chip and the substrate. Thus, it is the solder bumps that create the gap between the flip chip and the substrate.

The gap is typically underfilled with a fluid material that is brought in contact with the edge of the gap. Capillary action wicks the fluid between the flip chip and the substrate, around the solder bumps, and filling the gap. However, various process parameters, such as contamination of one or both of the flip chip or substrate surfaces, impurity of the fluid material, or improper processing conditions, can result in an incomplete underfill of the flip chip. This may leave small pockets or voids within the gap where there is no underfill material.

If the underfill material is designed to help conduct heat away from the flip chip, the voids may result in hot spots in the flip chip during use, and ultimately device failure. The voids may also create stress concentrations resulting in fatigue cracking and functional failure from thermal cycling during normal functioning of the integrated circuit. Therefore, it is typically regarded as essential to have as complete an underfill as possible.

Another drawback of this customary, capillary action method of underfilling the flip chip is that it is by nature a very labor intensive process which is not readily given to automation. Thus, the process is prone to the yield loss inherent with manual processes, and also the relatively high cost that is typically associated with manual processes.

What is needed, therefore, is a method of packaging an integrated circuit that more readily lends itself to automation and reduces the occurrence of incomplete underfill.

SUMMARY OF THE INVENTION

The above and other objects are met by a method of packaging an integrated circuit where an integrated circuit is connected to a substrate. A reservoir body is applied to the substrate, and the reservoir body and substrate define at least one reservoir and at least one flow gate. The reservoir body, substrate, and integrated circuit define a flow ring which extends at least partially around the circumference of the integrated circuit. A compound is dispensed into the reservoirs, and is flowed through the flow gates and into the flow ring, underfilling the integrated circuit.

The flow gate regulates the flow of compound from the reservoir into the flow ring. The flow ring essentially comprises a gap between the reservoir body and the integrated circuit, which receives compound from the flow gate, and allows compound to underfill the integrated circuit. The flow ring may be only as wide as the flow gate, and thus may appear to be a part of the flow gate, or may be wider than the flow gate, extending at least partially, and optionally completely, around the integrated circuit.

A packaged integrated circuit according to the invention has an integrated circuit connected to a substrate. A reservoir body is fixedly applied to the substrate, and the reservoir body and substrate define at least one reservoir and at least one flow gate. The reservoir body, substrate, and integrated circuit define a flow ring. A compound is disposed between the integrated circuit and the substrate, and the compound also forms a fillet in the flow ring.

The reservoirs allow the total amount of compound needed to underfill the integrated circuit to be dispensed all at one time. The flow gates regulate the flow of compound from the reservoirs into the flow ring. The compound spreads relatively quickly through the flow ring, and then wicks under the integrated circuit from the flow ring. Because several different amounts of compound do not need to be dispensed at different times, the process is easily adaptable to automated manufacturing techniques.

BRIEF DESCRIPTION OF THE DRAWINGS

Further advantages of the invention will become apparent by reference to the detailed description of preferred embodiments when considered in conjunction with the following drawings, in which like reference numerals denote like elements throughout the several views, and which are not to scale so as to more clearly show the finer details, and wherein.

DETAILED DESCRIPTION OF THE INVENTION

Figure 1A:
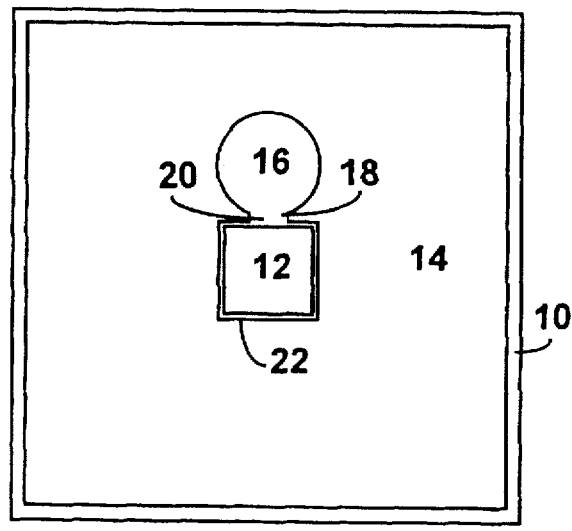
FIG. 1A is a top plan view of a first embodiment of a reservoir body on a substrate.

Referring now to the drawings, there is depicted in FIG. 1A a first embodiment of a reservoir body 14 which has been applied to a substrate 10. In the embodiment depicted the reservoir body 14 is somewhat smaller in length and width than the substrate 10, but in other embodiments the reservoir body 14 is the same size as, or larger than the substrate 10.

The reservoir body 14 may be either fixedly applied, or removably applied to the substrate 10, as discussed in more detail below. If fixedly applied, an adhesive epoxy, for example, or mechanical means such as pins or screws may be used to apply the reservoir body 14 to the substrate 10. If the reservoir body 14 is to be removably applied to the substrate 10, then a temporary means such as a clamp may be used.

The reservoir body 14 is fashioned of any material which is compatible with traditional integrated circuit packaging materials. For example, materials such as plastic, metal, epoxy, polyimide, or ceramic may be used. If the reservoir body 14 is to remain affixed to the substrate 10, then a material which will also impart an enhanced degree of rigidity to the final package may be chosen for its construction.

Figure 2:
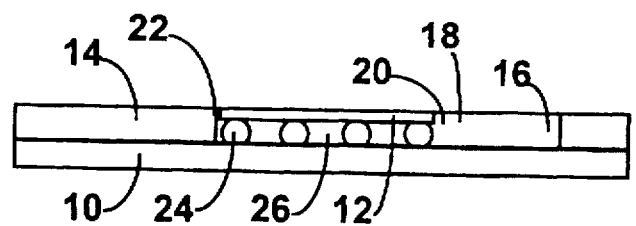
FIG. 2 is a cross-sectional view of a reservoir body on a substrate.

The reservoir body 14 has a cut out section 22 which allows for an integrated circuit 12 to connected to the substrate 10. The integrated circuit 12 is preferably a flip chip, and is preferably electrically connected to the substrate 10 by means of solder bumps 24, as depicted in FIG. 2. Because the solder bumps 24 are disposed between the integrated circuit 12 and the substrate 10, a gap 26 is left between the integrated circuit 12 and the substrate 10. It is this gap 26 which the underfill process is designed to fill.

Referring again to FIG. 1A, the reservoir body 14 and the substrate 10 define a generally circular shaped reservoir 16 and a flow gate 18. The reservoir body 14, substrate 10, and integrated circuit 12 also define a flow ring 20. In the embodiment depicted in FIG. 1A, the flow gate 18 and the flow ring 20 are approximately the same width, and may appear to be the same element. However, in other embodiments, depicted and described hereafter, the distinctions between the flow gate 18 and the flow ring 20 will be more apparent. Also as depicted in FIG. 1A, the flow ring 20 extends only partially around the circumference of the integrated circuit 12.

A fluid compound, designed to underfill the integrated circuit 12 and fill the gap 26, is dispensed into the reservoir 16. Preferably, an amount sufficient to completely underfill the integrated circuit 12 is dispensed at one time into the reservoir 16. In an alternate embodiment, a lesser amount of compound is dispensed initially, and the balance of the compound required is dispensed at a later time. The compound flows through the flow gate 18 at a rate designed to allow for a controlled flow of compound into the flow ring 20 and under the integrated circuit 12.

If the flow gate 18 is too wide and allows for too great a flow of compound, the underfill process may proceed too quickly, leaving air pockets or voids between the integrated circuit 12 and the substrate 10. If the flow gate 18 is too narrow and unduly restricts the flow of compound into the flow ring 20, then the underfill process may proceed too slowly, trapping the compound in the reservoir 16, and requiring too great a time for the process to complete.

Whatever space there may be between the integrated circuit 12 and the reservoir body 14 in the region of the cut out section 22 is preferably narrow enough to restrict compound flow between the integrated circuit 12 and the reservoir body 14, and so compound mainly flows under the integrated circuit 12 from the areas of the integrated circuit 12 that are adjacent the flow ring 20.

Figure 1B:
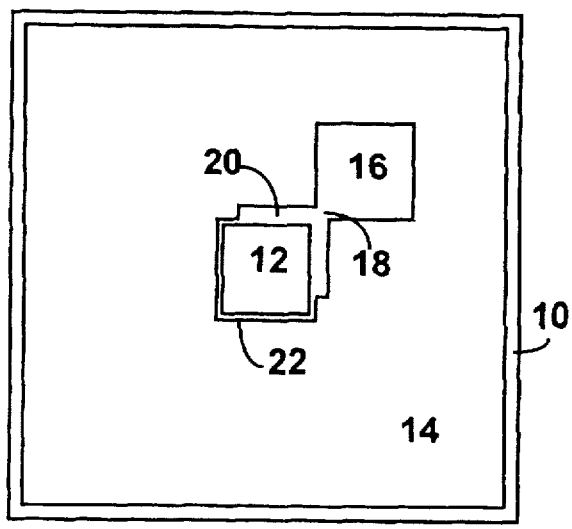
FIG. 1B is a top plan view of a second embodiment of a reservoir body on a substrate.
Figure 1C:
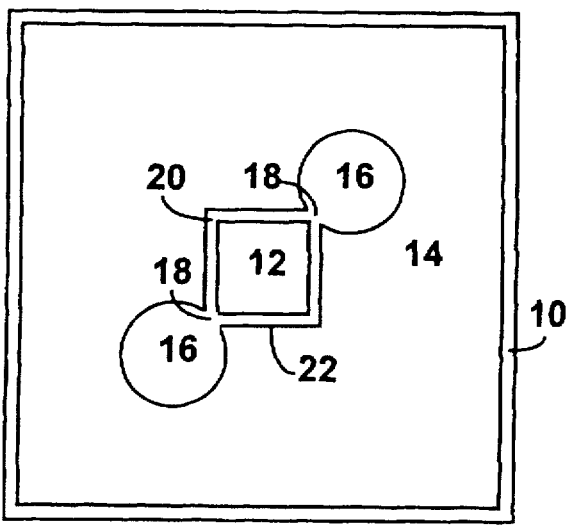
FIG. 1C is a top plan view of a third embodiment of a reservoir body on a substrate.

FIG. 1B depicts a second embodiment of the reservoir body 14. In this embodiment the reservoir 16 is located at the corner of the integrated circuit 12, and is rectangular in shape. Also, as depicted in FIG. 1B, the flow ring 20 is somewhat wider than the flow gate 18, and extends to a greater extent around the circumference of the integrated circuit 12. FIG. 1C depicts a third embodiment of the reservoir body 14. In this embodiment there are two reservoirs 16, and the flow ring 20 extends completely around the circumference of the integrated circuit 12.

Figure 3:
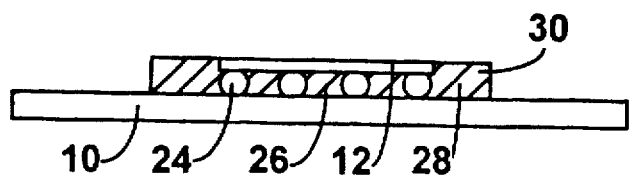
FIG. 3 is a cross-sectional view of an underfilled integrated circuit.

After the compound 28 has been dispensed into the reservoir 16, and has filled the gap 26, the reservoir body 14 may be removed from the substrate 10, as depicted in FIG. 3. The compound 28 tends to form a fillet 30 at the edges of the integrated circuit 12 where the flow ring 20 was located. This fillet 30 tends to aid in securing the integrated circuit 12 to the substrate 10, resulting in a more durable package.

Figure 4:
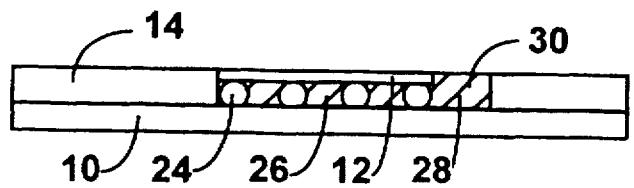
FIG. 4 is a cross-sectional view of an underfilled integrated circuit with the reservoir body fixedly applied to the substrate.

The reservoir body 14 may be left in place, as depicted in FIG. 4. In this embodiment the reservoir body 14 will tend to make the final package more rigid, which also tends to result in a more durable package. The reservoir body 14 may also help conduct heat away from the integrated circuit 12. Also in this embodiment, the flow ring did not extend along the left side of the integrated circuit 12. If the compound 28 has adhesive properties, then it may be the sole means of fixedly attaching the reservoir body 14 to the substrate 10.

In a more traditional method, the operator would have to manually apply small amounts of compound 28 at the edge of the integrated circuit 12, and at frequent intervals of time. If the operator did it too quickly or too slowly, or in the wrong amounts, voids could form under the integrated circuit 12. Further, the technique of the operator was important in not applying the compound 28 to those portions of the substrate 10 on which the compound 28 would inhibit performance of the packaged device.

By implementing a method of the invention such as described above, the underfilling operation may be substantially automated. For example, the reservoir bodies 14 may be automatically applied to the substrates 10. In a subsequent operation, the compound 28 may be automatically dispensed into the reservoir 16. No operator intervention is then required as the compound 28 flows out through the flow gate 18, into the flow ring 20, and wicks under the integrated circuit 12.

While specific embodiments of the invention have been described with particularity above, it will be appreciated that the invention is equally applicable to other processes and is capable of numerous modifications and substitutions of parts and steps without departing from the scope of the invention.

What is claimed is:

1. A method of underfilling an integrated circuit with a compound, the integrated circuit having a top surface and a bottom surface, the method comprising:

connecting the integrated circuit to a substrate with attachment structures disposed between the bottom surface of the integrated circuit and the substrate, the attachment structures separating and creating a gap between the bottom surface of the integrated circuit and the substrate, applying a reservoir body to the substrate, the reservoir body and substrate defining at least one reservoir and at least one flow gate, and the reservoir body, substrate, and integrated circuit defining a flow ring which extends at least partially around the circumference of the integrated circuit, dispensing and amount of the compound into the at least one reservoir, the amount of compound dispensed into the at least one reservoir being sufficient to fill the gap between the bottom surface of the integrated circuit and the substrate, the compound freely flowing at a rate of flow from the at least one reservoir, through the at least one flow gate, and into the flow ring, the at least one flow gate controlling the rate of flow of the compound into the flow ring, under filling the integrated circuit as the compound in the flow ring flows into the gap between the bottom surface of the integrated circuit and the substrate until the gap between the bottom surface of the integrated circuit and the substrate is filled with the compound, the top surface of the integrated circuit remaining exposed, and at least partially draining the at least one reservoir of the compound as the compound flows through the at least one flow gate, into the flow ring, and into the gap between the bottom surface of the integrated circuit and the substrate.

2. An integrated circuit underfilled according to the method of claim 1.

3. The method of claim 1 wherein the step of connecting the integrated circuit to a substrate further comprises electrically connecting the integrated circuit to a substrate.

4. An integrated circuit underfilled according to the method of claim 3.

5. The method of claim 1 wherein the step of applying a reservoir body to the substrate further comprises fixedly applying a reservoir body to the substrate using an adhesive.

6. An integrated circuit underfilled according to the method of claim 5.

7. The method of claim 1 further comprising removing the reservoir body from the substrate.

8. An integrated circuit underfilled according to the method of claim 7.

9. An underfilled integrated circuit having a top surface and a bottom surface, the integrated circuit comprising:

an integrated circuit connected to a substrate with attachment structures disposed between the bottom surface of the integrated circuit and the substrate, the attachment structures separating and creating a gap between the bottom surface of the integrated circuit and the substrate, a reservoir body fixedly applied to the substrate, the reservoir body and substrate defining at least one reservoir and at least one flow gate, and the reservoir body, substrate, and integrated circuit defining a flow ring which extends at least partially around the circumference of the integrated circuit, and a compound disposed between the bottom surface of the integrated circuit and the substrate, the compound filling the gap between the bottom surface of the integrated circuit and the substrate, the compound also forming a fillet in the flow ring.

10. The underfilled integrated circuit of claim 9 wherein the reservoirs are circular in shape.

11. The underfilled integrated circuit of claim 9 wherein the reservoirs are rectangular in shape.

12. The underfilled integrated circuit of claim 9 wherein the gates are narrower than the flow ring.

13. The under filled integrated circuit of claim 9 wherein the attachment structures are electrically conductive.

* * * * *